(12) United States Patent
Park et al.

(10) Patent No.: US 7,201,943 B2
(45) Date of Patent: Apr. 10, 2007

(54) METHODS OF FORMING ATOMIC LAYERS OF A MATERIAL ON A SUBSTRATE BY SEQUENTIALLY INTRODUCING PRECURSORS OF THE MATERIAL

(75) Inventors: In-Sung Park, Seoul (KR); Jeong-Hee Chung, Seoul (KR); Jae-Hyun Yeo, Incheon-si (KR)

(73) Assignee: Samsung Electronics Co., Ltd. (KR)

( * ) Notice: Subject to any disclaimer, the term of this patent is extended or adjusted under 35 U.S.C. 154(b) by 691 days.

(21) Appl. No.: 10/372,727

(22) Filed: Feb. 21, 2003

(65) Prior Publication Data
US 2004/0018307 A1 Jan. 29, 2004

(30) Foreign Application Priority Data
Jul. 26, 2002 (KR) .................. 10-2002-0044318

(51) Int. Cl.
*C23C 16/40* (2006.01)
(52) U.S. Cl. .................. 427/255.36; 427/255.391; 427/79; 427/96.8
(58) Field of Classification Search .......... 427/248.1, 427/255.28, 255.36, 255.391, 79, 96.8
See application file for complete search history.

(56) References Cited

U.S. PATENT DOCUMENTS

| | | | |
|---|---|---|---|
| 5,978,207 A * | 11/1999 | Anderson et al. ........... 361/311 |
| 6,133,086 A * | 10/2000 | Huang et al. ............... 438/240 |
| 6,225,185 B1 * | 5/2001 | Yamazaki et al. .......... 438/396 |
| 6,339,009 B1 | 1/2002 | Lee et al. | |
| 6,340,621 B1 * | 1/2002 | Anderson et al. ........... 438/396 |
| 6,342,277 B1 * | 1/2002 | Sherman ..................... 427/562 |
| 6,348,386 B1 * | 2/2002 | Gilmer ........................ 438/288 |
| 6,399,491 B2 * | 6/2002 | Jeon et al. .................. 438/680 |
| 6,420,230 B1 | 7/2002 | Derderian et al. | |
| 6,478,872 B1 * | 11/2002 | Chae et al. .................... 117/88 |
| 6,492,283 B2 | 12/2002 | Raaijmakers et al. | |
| 6,660,660 B2 * | 12/2003 | Haukka et al. ............. 438/778 |
| 6,767,582 B1 * | 7/2004 | Elers .......................... 427/253 |
| 6,780,704 B1 * | 8/2004 | Raaijmakers et al. ....... 438/239 |
| 6,784,049 B2 * | 8/2004 | Vaartstra ..................... 438/240 |
| 6,921,555 B2 * | 7/2005 | Nguyen et al. ........... 427/248.1 |
| 2002/0094634 A1 * | 7/2002 | Chung et al. ............... 438/240 |
| 2002/0115275 A1 * | 8/2002 | Choi .......................... 438/584 |
| 2002/0146511 A1 | 10/2002 | Chiang et al. | |
| 2003/0045048 A1 * | 3/2003 | Marsh ........................ 438/218 |
| 2003/0188682 A1 * | 10/2003 | Tois et al. ................... 117/105 |

FOREIGN PATENT DOCUMENTS

JP   2001-85423 A   3/2001

* cited by examiner

*Primary Examiner*—Bret Chen
(74) *Attorney, Agent, or Firm*—Myers Bigel Sibley & Sajovec, P.A.

(57) ABSTRACT

A thin film is formed using an atomic layer deposition process, by introducing a first reacting material including tantalum precursors and titanium precursors onto a substrate. A portion of the first reacting material is chemisorbed onto the substrate. Then, a second reacting material including oxygen is introduced onto the substrate. A portion of the second reacting material is also chemisorbed onto the substrate, to form an atomic layer of a solid material on the substrate. The solid material may be used as a dielectric layer of the capacitor and/or a gate dielectric layer of the transistor.

33 Claims, 11 Drawing Sheets

METHODS OF FORMING ATOMIC LAYERS OF A MATERIAL ON A SUBSTRATE BY SEQUENTIALLY INTRODUCING PRECURSORS OF THE MATERIAL

RELATED APPLICATION

This application claims the benefit of Korean Patent Application No. 2002-44318, filed Jul. 26, 2002, the disclosure of which is hereby incorporated herein by reference in its entirety as if set forth fully herein.

FIELD OF THE INVENTION

The present invention relates to methods of forming thin films, and more particularly to methods of forming thin films through Atomic Layer Deposition (ALD).

BACKGROUND OF THE INVENTION

Integrated circuit devices, such as logic and memory devices, are widely used in consumer and commercial applications. As the integration density of integrated circuit devices continues to increase, it may be desirable to form ultra thin layers, such as ultra thin dielectric layers, on a semiconductor substrate. These dielectric layers may be used, for example, as a gate dielectric layer of an insulated gate field effect transistor, also referred to as a MOSFET, and/or as a capacitor dielectric for an integrated circuit capacitor. As is well known to those having skill in the art, a field effect transistor includes spaced apart source and drain regions, a gate dielectric therebetween, and a gate electrode on the gate dielectric. Moreover, as is well known to those having skill in the art, an integrated circuit capacitor includes a first or lower electrode, a second or upper electrode, and a dielectric therebetween. Integrated circuit capacitors are widely used in integrated circuit memory devices such as Dynamic Random Access Memory (DRAM) devices.

Silicon dioxide is widely used as a dielectric layer for integrated circuit field effect transistors and/or capacitors. However, as the integration density of integrated circuits continues to increase, dielectric materials having a higher dielectric constant than silicon, such as $Ta_2O_5$, $Y_2O_3$, $HfO_2$, $ZrO_2$, $Nb_2O_5$, $BaTiO_3$, $SrTiO_3$ and/or other materials have been used.

Tantalum oxide ($Ta_2O_5$) has been widely used as the dielectric layer of a capacitor due to the potentially high thermal stability thereof. However, the tantalum oxide may react with a lower electrode of the capacitor. In particular, when polysilicon is used for the lower electrode, oxygen atoms contained in the tantalum oxide layer may react with silicon atoms contained in the polysilicon layer during a formation process of the tantalum oxide layer and/or during heat treatment after forming the tantalum oxide layer, so that the polysilicon layer may be oxidized. As a result, leakage current of the capacitor may increase.

Lower electrodes of a capacitor also have been made using metals, such as platinum (Pt), ruthenium (Ru), iridium (Ir) and the like, or of conductive metal nitride, such as titanium nitride (TiN). However, the metal or the conductive metal nitride used for the lower electrode may cause other problems.

In particular, the tantalum oxide layer may be continuously deposited in an atmosphere of oxygen by using a tantalum source and an oxygen source as an oxidizing agent. Examples of the tantalum source include $TaCl_5$, $Ta(OCH_3)_5$, $Ta(OC_2H_5)_5$, $Ta(OC_3H_7)_5$, $Ta(OC_4H_9)_5$, $Ta(OC_2H_5)(OC_3H_7)_4$, or $Ta(OC_2H_5)_4(DMAE)$ ($Ta(OC_2H_5)_4$ [$OC_2H_5N(CH_3)_2$], tetraethoxy tantalum dimethylaminoethoxide (hereinafter referred to as "TAT-DAME"), etc. Examples of the oxygen source include $O_2$, $H_2O$, $H_2O_2$, $N_2O$, alcohols including OH group, etc. The combination of the tantalum source and the oxidizing agent may oxidize the lower electrode, which may decrease the quality of the tantalum oxide layer.

For instance, when ruthenium is used for the lower electrode of the capacitor, a surface of the ruthenium may be oxidized by the oxygen source to form a ruthenium oxide ($RuO_2$) layer. The ruthenium oxide layer may prevent the tantalum oxide from being uniformly deposited on the lower electrode of the capacitor. When the tantalum oxide layer is used for a dielectric layer of a cylinder-shaped or a concave capacitor having a high aspect ratio, the above-mentioned low deposition quality may be particularly observed. That is, the tantalum oxide may not be deposited upon the ruthenium electrode at a lower opening portion of the cylindrical capacitor and may be excessively deposited on an upper opening portion of the cylindrical capacitor. Therefore, the step coverage of the tantalum oxide may be poor.

The dielectric layer of the capacitor can be deposited through a conventional Chemical Vapor Deposition (CVD) process, a low-pressure CVD (LPCVD) process, a plasma enhanced CVD (PECVD) process, and/or a sputtering process. See, for example, U.S. Pat. No. 6,339,009 and Japanese Published Application 2001-85423. However, the above and other CVD processes may be carried out at a relatively high temperature, which may have an adverse thermal effect on a device. Furthermore, a thin film layer deposited through the CVD process may have a non-uniform thickness and/or poor step coverage.

SUMMARY OF THE INVENTION

Embodiments of the invention provide methods of forming a thin film layer through an atomic layer deposition process. A first reacting material including a tantalum precursor and a titanium precursor is introduced to a substrate so that a portion of the first reacting material is chemisorbed onto the substrate. A second reacting material including oxygen is introduced to the substrate so that a portion of the second reacting material is chemisorbed onto the substrate to form a solid material thereon. In some embodiments, a thin film layer having a high dielectric constant, good step coverage, and/or a superior leakage current characteristic is thereby formed on the substrate.

Other methods of forming an atomic layer of a material on the substrate, according to other embodiments of the present invention, introduce a first precursor of the material to a substrate, such that a first portion of the first precursor is chemisorbed onto the substrate, and a second portion of the first precursor is not chemisorbed onto the substrate. At least some of the second portion of the first precursor that is not chemisorbed onto the substrate is then purged. A second precursor of the material is introduced to the substrate, such that a first portion of the second precursor is chemisorbed onto the substrate and reacts with the first portion of the first precursor that is chemisorbed onto the substrate to form the atomic layer of the material, and a second portion of the second precursor is not chemisorbed onto the substrate. At least some of the second portion of the second precursor that is not chemisorbed onto the substrate is purged.

Still other embodiments of the present invention form an atomic layer of a material on a substrate by introducing a first precursor of the material to the substrate in a purge gas flow. Then, the introducing the first precursor is discontinued while maintaining the purge gas flow. Then, a second precursor of the material is introduced to the substrate in the purge gas flow. Finally, the introducing the first precursor is discontinued while maintaining the purge gas flow.

Integrated circuit capacitors may be fabricated, according to some embodiments of the invention, by forming a lower electrode of the capacitor on a substrate, forming a dielectric layer of the capacitor including titanium tantalum oxide on the lower electrode, and forming an upper electrode of the capacitor on the dielectric layer. In order to form the dielectric layer of the capacitor, a first reacting material, a second reacting material, and a purge gas are discontinuously introduced onto the lower electrode, and a portion of the first reacting material and the second reacting material are chemisorbed onto the substrate. At least some non-chemisorbed first and second reacting materials are purged from the substrate. The first reacting material can include a tantalum precursor and a titanium precursor, and the second reacting material can include oxygen. The purging gas can include an inert gas.

Integrated circuit field effect transistors may be fabricated, according to some embodiments of the invention, by forming a gate dielectric layer of the transistor including titanium tantalum oxide on a substrate, forming a gate electrode on the gate dielectric layer, and forming source and/or drain regions, for example, by implanting impurities into the substrate using the gate electrode as a mask. In order to form the gate dielectric layer of the transistor, a first reacting material, a second reacting material, and a purge gas are discontinuously introduced onto the substrate, and a portion of the first reacting material and the second reacting material are chemisorbed onto the substrate. At least some non-chemisorbed first and second reacting materials are purged from the substrate. The first reacting material can include a tantalum precursor and a titanium precursor, and the second reacting material can include oxygen. The purging gas can include an inert gas.

According to embodiments of the present invention, a thin film layer may be formed to include titanium tantalum oxide so that the dielectric constant of the thin film layer may be increased, and the step coverage and leakage current characteristic thereof also can be improved. Further, the titanium tantalum oxide thin film layer may form the dielectric layer of a capacitor and/or the gate oxide layer of a transistor. Therefore, thin films according to embodiments of the present invention can be widely used in semiconductor devices having a high degree of integration.

DETAILED DESCRIPTION

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Also, each embodiment described and illustrated herein includes its complementary conductivity type embodiment as well.

Figure 1A:
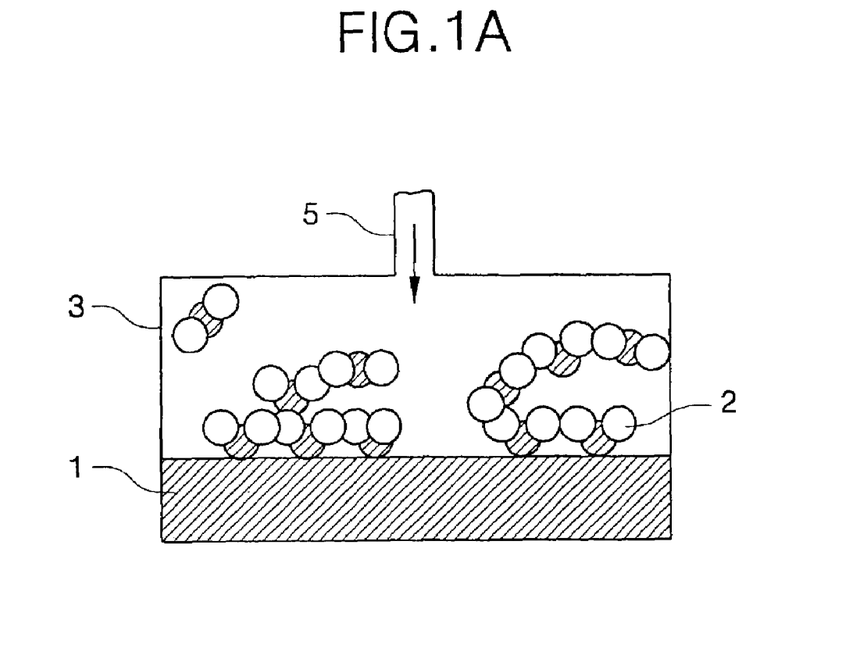
FIGS. 1A to 1E are cross-sectional views showing a method for forming a thin film through an ALD process according to embodiments of the present invention.

FIGS. 1A to 1E are cross-sectional views showing a method for forming a thin film through an ALD process according to embodiments of the present invention. Referring to FIG. 1A, a substrate 1 of semiconductor material such as silicon is disposed in a depositing chamber, conceptually shown as 3, and a first reacting material 2 including a tantalum precursor and a titanium precursor is introduced to the substrate 1. The tantalum precursor includes $TaCl_5$, $Ta(OCH_3)_5$, $Ta(OC_2H_5)_5$, $Ta(OC_3H_7)_5$, $Ta(OC_4H_9)_5$, $Ta(OC_2H_5)(OC_3H_7)_4$, TAT-DAME ($Ta(OC_2H_5)_4 [OC_2H_5N(CH_3)_2]$), and/or a combination thereof. In some embodiments, only one tantalum precursor is used. Hereinafter, the word "DAME" is used as an abbreviation of dimethylaminoethoxide, meaning the group of $-OC_2H_5N(CH_3)_2-$. Further, the titanium precursor includes $TiCl_4$, $Ti(OCH_3)_4$, $Ti(OC_2H_5)_4$, $Ti(OC_3H_7)_4$, $Ti(OC_4H_9)_4$, $Ti(OC_2H_5)(OC_3H_7)_4$, $Ti(OC_3H_7)_2(O_2C_{11}H_{19})_2$, $Ti(OEt_2)(DAME)_2$, or a combination thereof. In some embodiments, only one titanium precursor is used. Hereinafter, the word "OEt" is used to designate the group of $-OC_2H_5-$.

In some embodiments, the tantalum precursor and the titanium precursor are introduced to the substrate 1 in a mixed state, which is referred to as a mixed precursor. Examples of the mixed precursors are TAT-DAME/$Ti(OEt)_2(DAME)_2$ (hereinafter, referred to as TT), and/or $Ta(OC_2H_5)_5/Ti(OC_2H_5)_4$. The mixed precursor is preferably introduced to the substrate 1 through the same introducing line 5 in a mixed state. When the first reacting material 2 is introduced, an inert gas can be used as a carrier gas for carrying the first reacting material into the chamber 3. The inert gas includes argon (Ar) gas, nitrogen (N₂) gas, combinations thereof and/or other carrier gases.

Figure 1B:
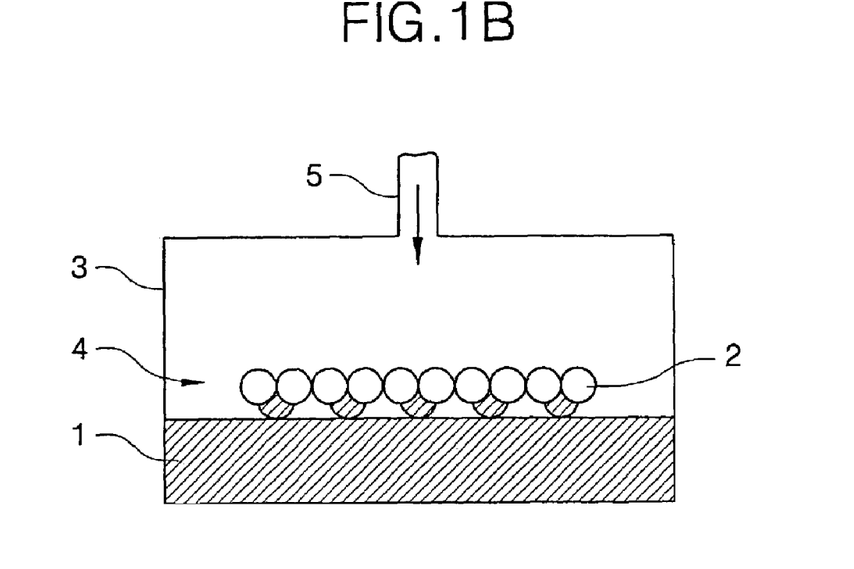

Referring to FIG. 1B, a first portion of the first reacting material 2 is chemisorbed (chemically absorbed) onto the substrate 1, and therefore, a layer 4 is formed on a surface of the substrate 1. A second portion of the first reacting material 2 is physisorbed (physically absorbed) on the upper (outer) portion of the layer 4. That is, the second portion of the first reacting material 2 is loosely combined with the layer 4. Continuously, the inert gas, which is used as a carrier gas of the first reacting material, is again introduced into the chamber 3 without the first reacting material 2. As a result, the non-chemisorbed first reacting material, namely at least some of the second portion of the first reacting material, is purged out from the chamber 3 and, in some embodiments, only chemisorbed layer 4 of the first reacting material 2 remains on the substrate 1.

Figure 1C:
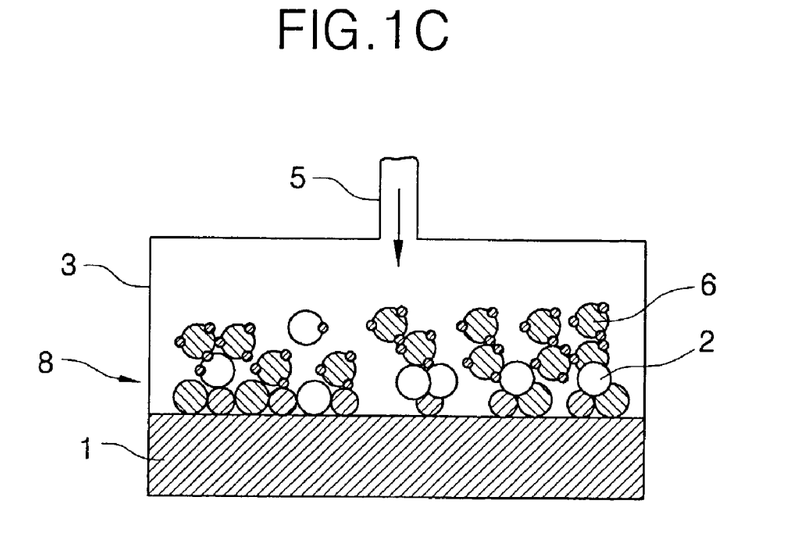
Figure 1D:
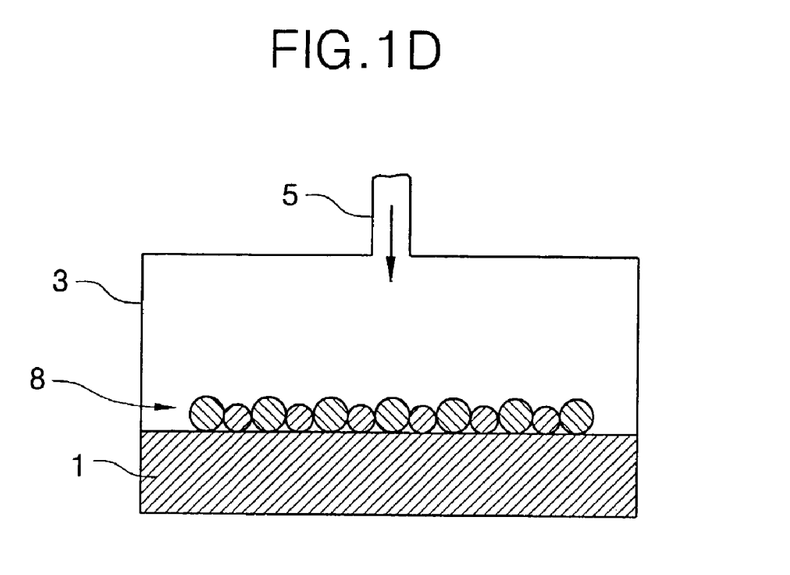

Referring to FIG. 1C, a second reacting material 6 is introduced into the chamber 3. The second reacting material 6 includes $O_2$, $O_3$, $H_2O$, $H_2O_2$, $N_2O$, alcohols having —OH group, or a combination thereof. In some embodiments, only a single second reacting material is used. In some embodiments, the second reacting material is introduced in an activated state by ultraviolet rays, in an activated state of a plasma, in an activated state by a remote plasma process and/or using other activation techniques. For example, an ozone ($O_3$) gas created by a plasma generator, a plasma $O_2$ gas, a plasma $N_2O$ gas, and/or a remote plasma $O_2$ gas can be used as the second reacting material. Another example of the second reacting material can include an oxygen ($O_2$) gas and/or ozone ($O_3$) gas created by an ozone generator. Then, the second reacting material 6 is reacted with the chemisorbed layer 4 of the first reacting material 2. As a result, a solid material 8 of an atomic unit is formed on the substrate 1. Namely, the solid material 8 including tantalum titanium is formed on the substrate 1 through reaction between the first reacting material 2 and the second reacting material 6.

Figure 1E:
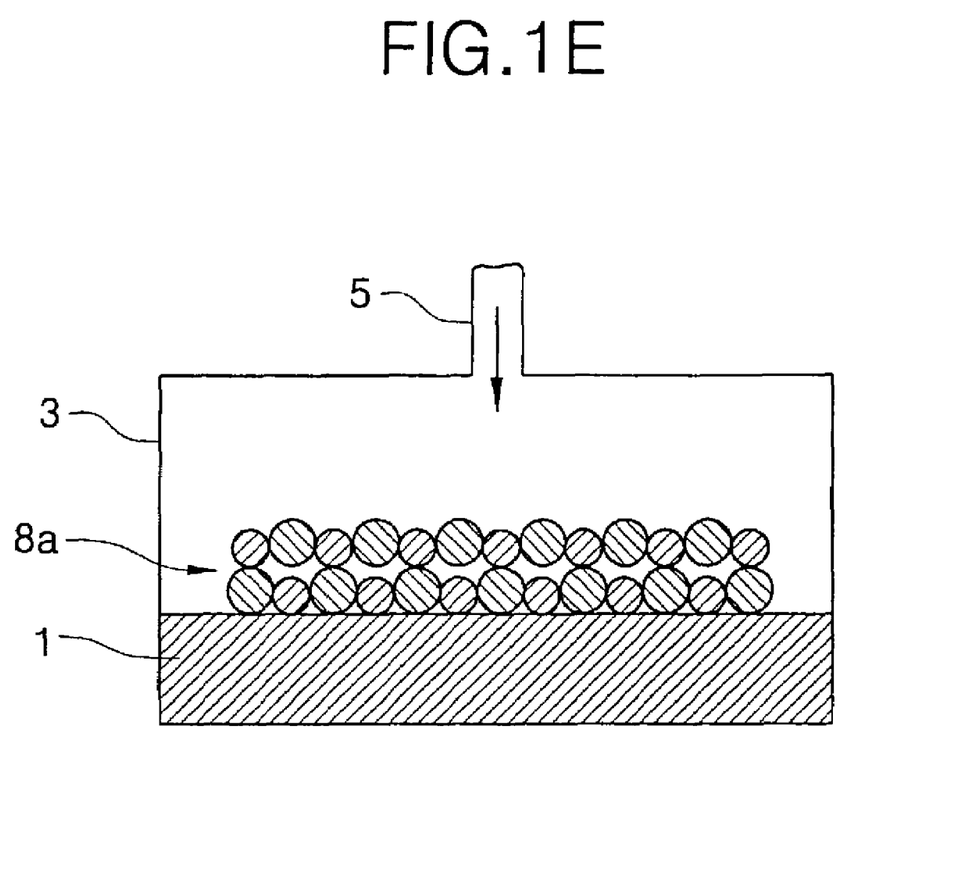

Referring to FIG. 1D, the inert gas is again introduced into the chamber 3, without the second reacting material 6, and at least some of the non-chemisorbed second reacting material 6 is purged from the chamber. As a result, the solid material 8 including tantalum titanium is completely formed on the substrate 1. That is, a thin film having a thickness of an atomic unit (hereinafter, referred to as and atomic layer) is formed on the substrate 1. Sequential repeating of the steps of introducing the first reacting material, purging the first reacting material, introducing the second reacting material, and purging the second reacting material can form an atomic layer 8a having a desired thickness as shown in FIG. 1E.

Subsequently, in some embodiments, the atomic layer 8a having a predetermined thickness is heat-treated to fill vacancies in the atomic layer. The heat treatment is carried out by radiating ozone ($O_3$) ultraviolet rays at a temperature range of about 650° C. to about 700° C., by flowing activated oxygen at a temperature range of about 700° C. to about 800° C. and/or using other techniques. Therefore, the atomic layer 8a can be condensed into a compact structure.

As is well known, the tantalum precursor and the titanium precursor, which may be used as precursors in a conventional CVD process, may be decomposed at a high temperature. Therefore, in some embodiments, the ALD process using the tantalum precursor and the titanium precursor according to embodiments of the present invention is carried out in a temperature range of about 200° C. to about 600° C. and, in some embodiments, at a temperature of about 400° C. Further, the tantalum precursor and the titanium precursor has a higher vapor pressure than that of some other precursors, such as a halogenide precursor. Namely, the number of molecules in a vapor state of the tantalum precursor or the titanium precursor is larger than that of some other precursors. Therefore, in performing the ALD process, a larger quantity of precursor gas may be provided into the process chamber compared with the other precursors, so that a larger number of the precursor gas molecules can reach a bottom surface of a stepped portion of the atomic layer. As a result, when the tantalum precursor and the titanium precursor are used during a deposition process according to embodiments of the present invention, the layer can be deposited to have good step coverage.

In addition, since the conventional CVD process for depositing a thin film is carried out at not less than about 500° C., a heat budget of high temperature is created during the process, which may make it difficult to deposit the thin film with a thickness no more than about 20 Å. However, ALD processes according to some embodiments of the present invention can deposit the thin film with a thickness of several Ångstroms.

As described above, embodiments of the present invention can deposit a tantalum titanium oxide (TaTiO) layer having relatively good step coverage and relatively constant thickness at a relatively low temperature. Furthermore, an atomic ratio of the tantalum and the titanium in the TaTiO layer can be controlled according to embodiments of the present invention. In one embodiment, the atomic ratio of the tantalum and the titanium is set to be about 1:0.01 to 0.2. This controlling of the atomic ratio of the tantalum and the titanium can improve a dielectric constant and/or a leakage current characteristic of the thin film.

Hereinafter, characteristics of a layer deposited by embodiments of the present invention will be described. A TaTiO layer specimen was deposited through an ALD process in which TAT-DAME was used as the tantalum precursor, $Ti(OEt)_2(DAME)_2$ was used as the titanium precursor, and ozone ($O_3$) was used as an oxidizer. A TT depositing step, a first argon (Ar) purging step, an ozone ($O_3$) depositing step, and a second argon (Ar) purging step were carried out for 4 seconds, 4 seconds, 2 seconds, and 4 seconds, respectively. A temperature of the chamber was varied from about 200° C. to about 550° C. during the ALD process. Then, various characteristics of the TaTiO layer specimen were measured.

Relation between the Deposition Rate and the Deposition Temperature

Figure 2:
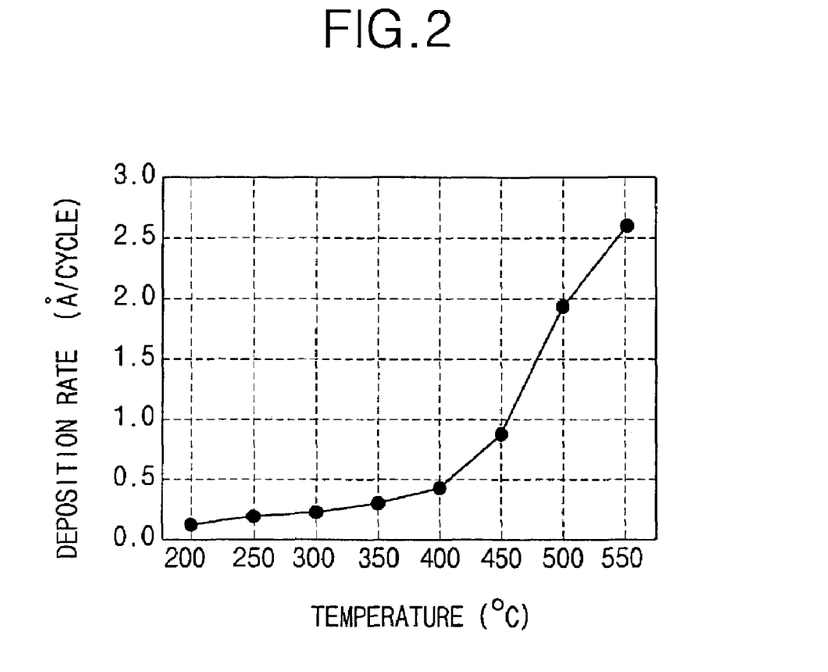
FIG. 2 is a diagram showing a relation between a deposition temperature and a deposition rate of tantalum titanium oxide layer according to embodiments of the present invention.

FIG. 2 is a graph showing a relation between a deposition temperature and a deposition rate of a tantalum titanium oxide layer deposited according to some embodiments of the present invention. The horizontal axis in FIG. 2 is a temperature of deposition, and the vertical axis is a deposition rate (Å/cycle).

Referring to FIG. 2, the deposition rate of the TaTiO layer has a minimum value at a temperature of about 200° C., and rapidly increases at a temperature of 450° C., which indicates that the TaTiO layer shows ALD characteristics in a temperature range of about 200° C. to about 450° C., and shows CVD characteristics at a temperature of about 450° C. or more. Accordingly, in some embodiments, the TaTiO layer is deposited at a temperature less than about 450° C. and, in other embodiments, in a temperature range of about 250° C. to about 350° C.

Relation between Number of Deposition Cycles and a Layer Thickness

Figure 3:
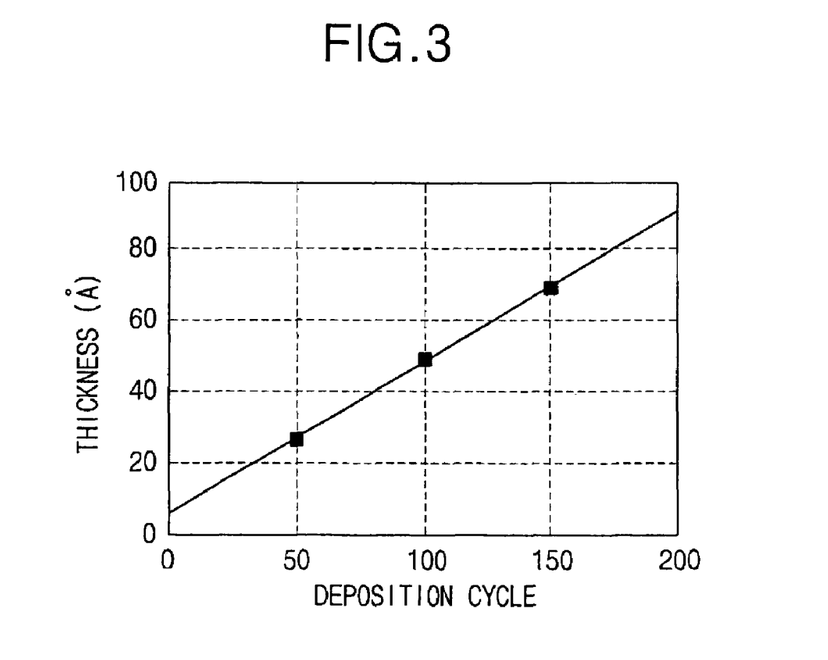
FIG. 3 is a graph showing a relation between a thickness of tantalum titanium oxide layer and a deposition cycle thereof according to embodiments of the present invention.

FIG. 3 is a graph showing a relation between a thickness of the TaTiO layer and the number of deposition cycles thereof according to some embodiments of the present invention. The horizontal axis of the graph as shown in FIG. 3 is number of deposition cycles and the vertical axis is layer thickness. The deposition process was carried out at a temperature of about 400° C.

Referring to FIG. 3, since the TaTiO layer shows the ALD characteristics around the temperature of 400° C., the thickness of the layer is linearly increased as the number of deposition cycles is increased. Therefore, the TaTiO layer deposited through the ALD process using the TT and the ozone ($O_3$), can have good thickness controllability and superior uniformity, and can also be reduce a pattern-loading effect. In addition, the TaTiO layer can provide good step coverage of no less than about 90% in a structure having an aspect ratio no less than about 10:1, in some embodiments.

Relation between Post Heat Treatment and Crystallization of a Thin Film

Figure 4:
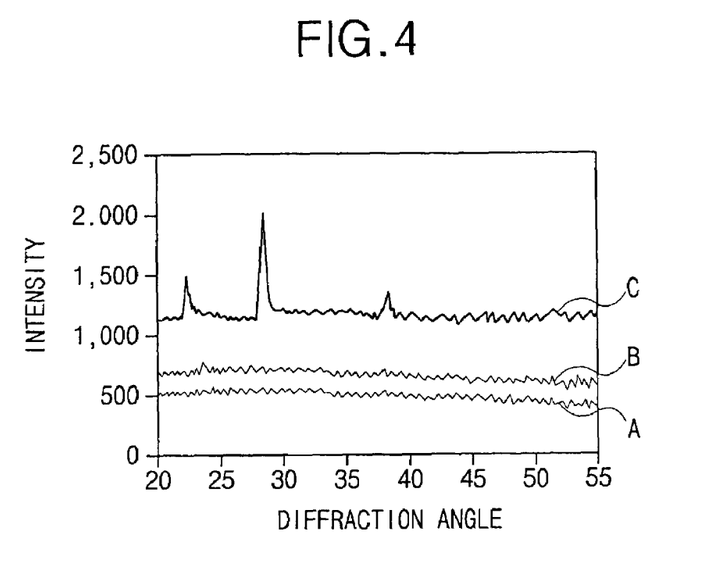
FIG. 4 is a graph showing a crystal density of tantalum titanium oxide layer before and after a heat treatment according to embodiments of the present invention.

FIG. 4 is a graph showing a crystal density of the TaTiO layer before and after a heat treatment. An X-ray diffraction (XRD) analysis apparatus was used for measuring the crystal density. In FIG. 4, curve A shows the crystal density of the TaTiO layer before a heat treatment. Curve B shows the crystal density of the TaTiO layer after the heat treatment wherein activated oxygen is introduced at a temperature of about 650° C. Curve C shows the crystal density of the TaTiO layer after the heat treatment wherein activated oxygen is introduced at a temperature of about 700° C. The horizontal axis is the diffraction angle, also called a Bragg diffraction angle, and the vertical axis is an intensity of emitted ions.

Referring to FIG. 4, it can be seen that a state of the TaTiO layer as shown in curve A and curve B is amorphous, and a state of the TaTiO layer in curve C is not amorphous since the curve C shows at least one peak. The peak points of the curve C are formed since the state of the TaTiO layer is transferred from the amorphous state into a crystal structure of an orthorhombic system when activated oxygen is introduced at a temperature of about 700° C. Therefore, ozone ($O_3$) radiation in a temperature range of about 650° C. to about 750° C. or heat treatment wherein activated oxygen is introduced at a temperature of about 700° C. to about 800° C. may be used for depositing the TaTiO layer of a compact crystal structure. Furthermore, tantalum oxide (TaO) is found at the peak points of the curve C, which appears to indicate that the TaTiO layer is not formed of chemical bonds of Ta—Ti or Ta—Ti—O but, rather, chemical bonds of Ta—O and Ti—O independent from each other. In experiments related to FIG. 4, the chemical bond of Ti—O was rare, which apparently is not because Ti—O bond does not exist in the TaTiO layer but, rather, appears to be because the number of Ta atoms is relatively larger than that of the Ti atoms.

Depth Profile of a Thin Film

Figure 5:
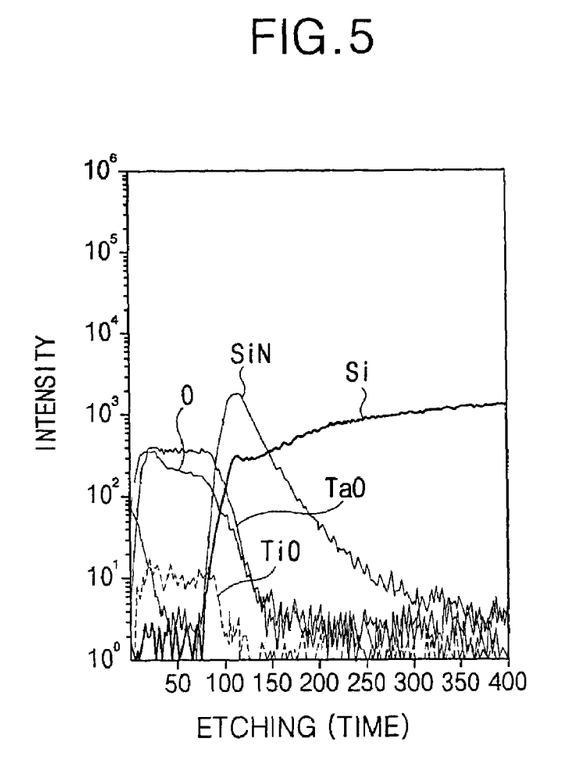
FIG. 5 is a graph showing a relation between an etching time and ion density emitted from the cross-sectional surface of tantalum titanium oxide layer according to embodiments of the present invention.

FIG. 5 is a graph showing a relation between an etching time and ion density emitted from the cross-sectional surface of the TaTiO layer deposited by embodiments of the present invention. The graph is formed based on data measured by time of flight secondary ion mass spectrometer (TOF-SIMS). The horizontal axis is an etching time, and the vertical axis is intensity of ions that is emitted from an etched cross-sectional surface per unit time. A specimen TaTiO layer of the FIG. 5 was deposited according to the above-described method after a nitride layer was deposited on a silicon substrate.

Referring to FIG. 5, the chemical bond of TaO and TiO was uniformly detected irrespective of the TaTiO layer depth. Therefore, the TaTiO layer can be deposited to have good stoichiometric characteristics without including impurities that can be electron trap sites and/or leakage current sites.

Figure 6A:
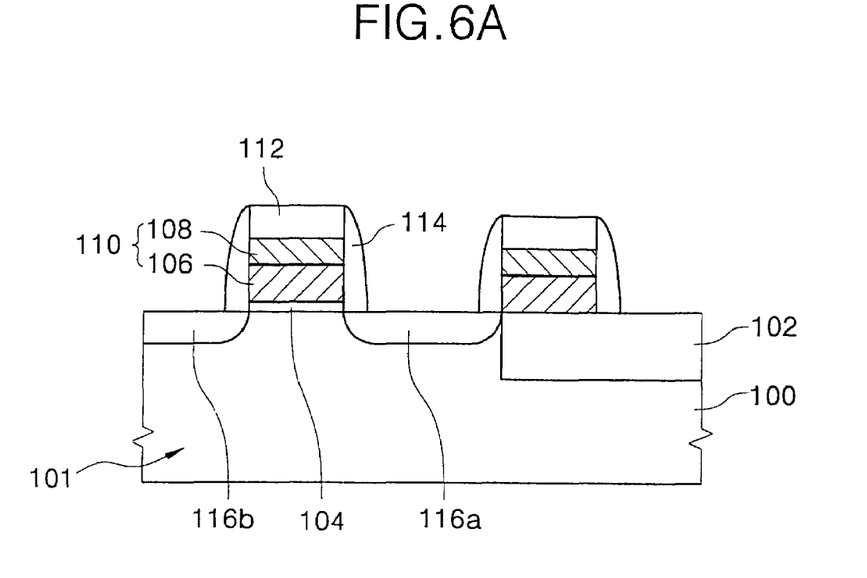
FIGS. 6A to 6E are cross-sectional views showing a method for fabricating a semiconductor device according to embodiments of the present invention.

FIGS. 6A to 6E are cross-sectional views showing methods for fabricating a semiconductor device according to embodiments of the present invention. Referring to FIG. 6A, a gate dielectric layer 104, gate electrode 110 and source/drain regions 116a and 116b are formed on a semiconductor substrate 100 including an active area 101 defined by an isolation region (or field area) 102. It may be desirable for a thin gate dielectric layer have a thickness of about 10 Å or so, so that the gate dielectric layer 104 may be deposited using embodiments of the present invention. Namely, in some embodiments, the gate dielectric layer 104 is formed to include TaTiO through the ALD process using an activated oxidizer. Examples of the activated oxidizer may include tantalum precursors, titanium precursors, ozone ($O_3$), plasma $O_2$, remote plasma $O_2$ and/or plasma $N_2O$. The TT and ozone ($O_3$) can be used for forming the gate dielectric layer 104 including the TaTiO in some embodiments.

The gate electrode 110 may have a polycide structure including a polysilicon layer 106 doped with impurities and a silicide layer 108. A capping insulating layer 112 is formed on an upper surface of the gate electrode 110, and a side spacer 114 is also formed on side surfaces of the gate electrode 110. Both the capping insulating layer 112 and the side spacer 114 may comprise silicon oxide and/or silicon nitride.

Figure 6B:
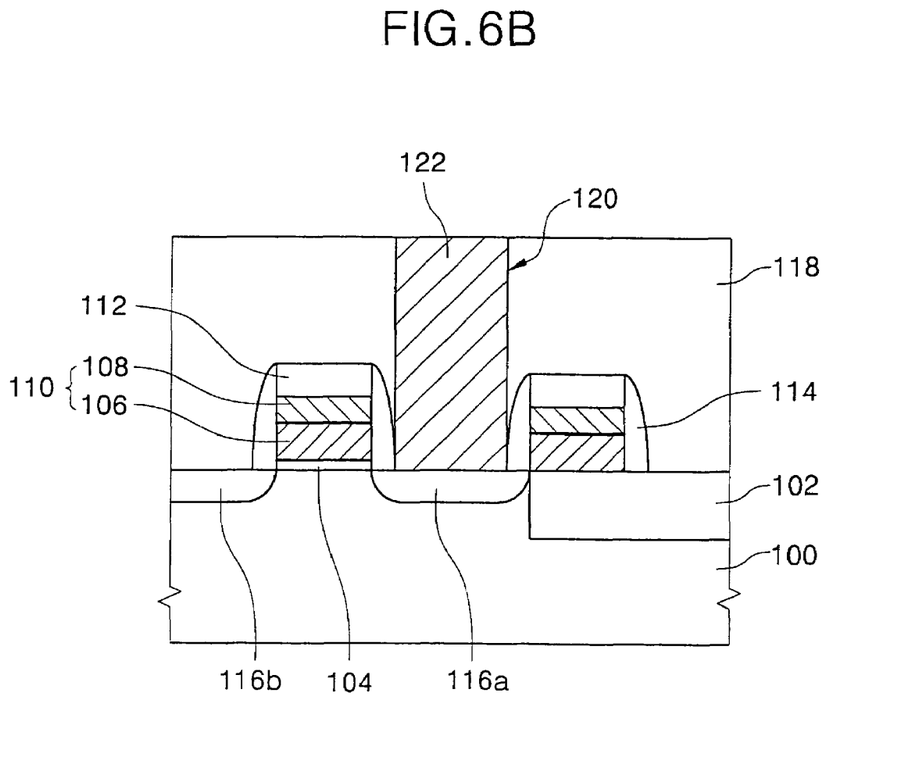

Referring to FIG. 6B, a first insulating layer 118 comprising an oxide is formed on the whole surface of the substrate 100. Then the first insulating layer 118 is selectively etched through a photolithography process to thereby form a contact hole 120 partially exposing the source region 116a. Subsequently, a first conductive layer, for example a polysilicon layer doped with phosphorus (P), is deposited in the contact hole 120 and on the first insulating layer 108, and removed to a surface of the first insulating layer 118 through an etch-back process and/or a chemical mechanical polishing (CMP) process. As a result, the contact hole 120 is filled with the first conductive layer to thereby form a contact plug 122.

Figure 6C:
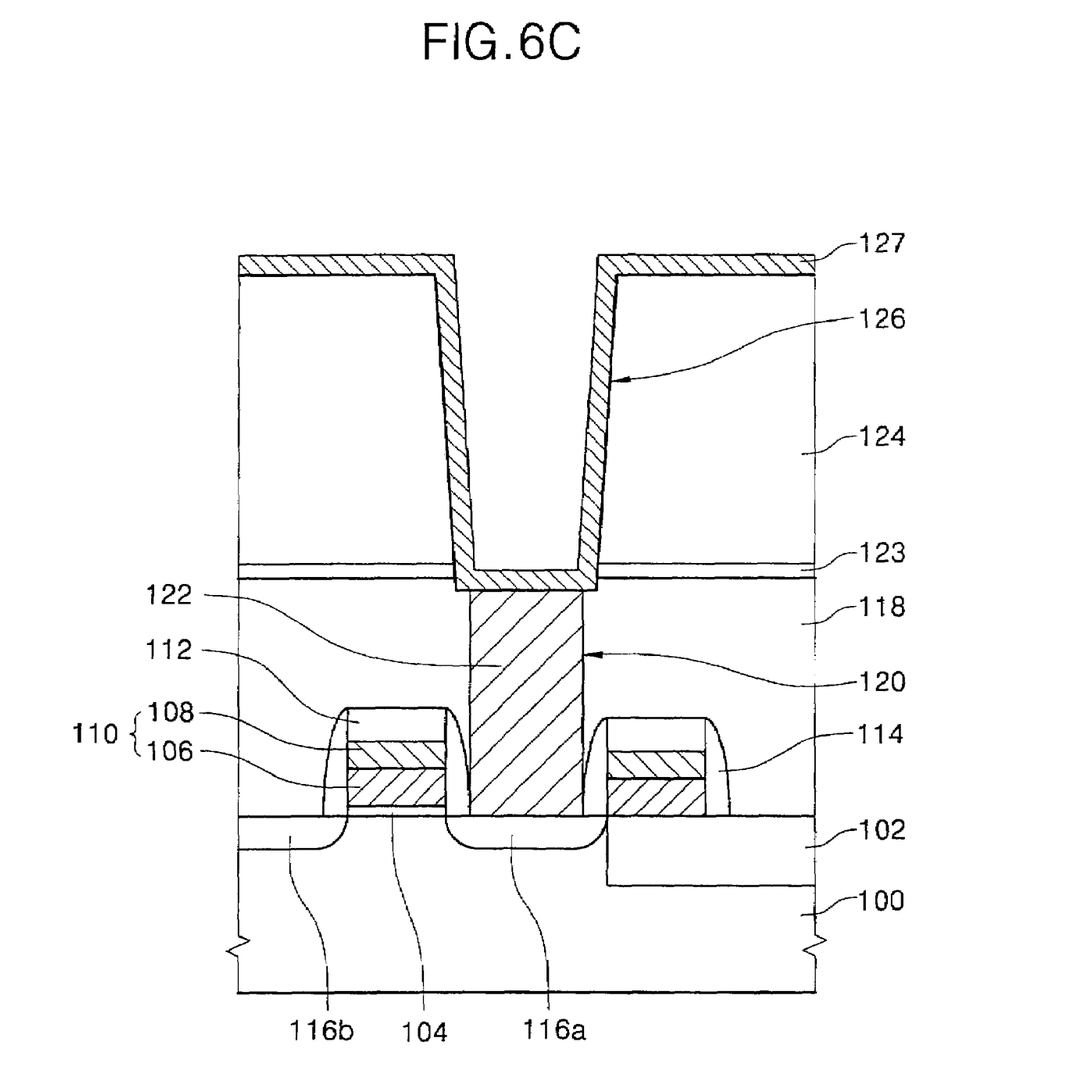

Referring to FIG. 6C, an etch stop layer 123 is formed on the contact plug 122 and/or the first insulating layer 118. In some embodiments, the etch stop layer 123 can be formed as a high etching selectivity layer with respect to the first insulating layer 118, such as silicon nitride ($Si_xN_y$, wherein x and y are positive numbers) layer and/or a silicon oxynitride (SiON) layer. A second insulating layer 124 comprising an oxide is formed on the etch stop layer 123, and then is selectively etched, to thereby form an opening portion 126 exposing the contact plug 126. In more detail, the second insulating layer 124 is selectively etched until the etch stop layer 123 is exposed, and then is still further etched, that is over-etched. As a result, the opening portion 126 is formed. A sidewall of the opening portion 126 may be formed to slope downwards so that a cross-sectional area of an opening upper portion of the opening portion 126 is larger than that of a bottom portion of the opening portion 126, since an etching rate of the opening upper portion is different than that of the bottom portion of the opening portion due to a loading effect during the etching process. Then, a second conductive layer 127 is deposited on the sidewall and on the bottom surface of the opening portion 126 and on a surface of the second insulating layer 124. The second conductive layer 127 comprises a semiconductor material such as polysilicon, rare metals, such as ruthenium (Ru), platinum (Pt), Iridium (Ir) and the like, or conductive metal nitride, such as titanium nitride (TiN), tantalum nitride (TaN) and/or tungsten nitride (WN).

Figure 6D:
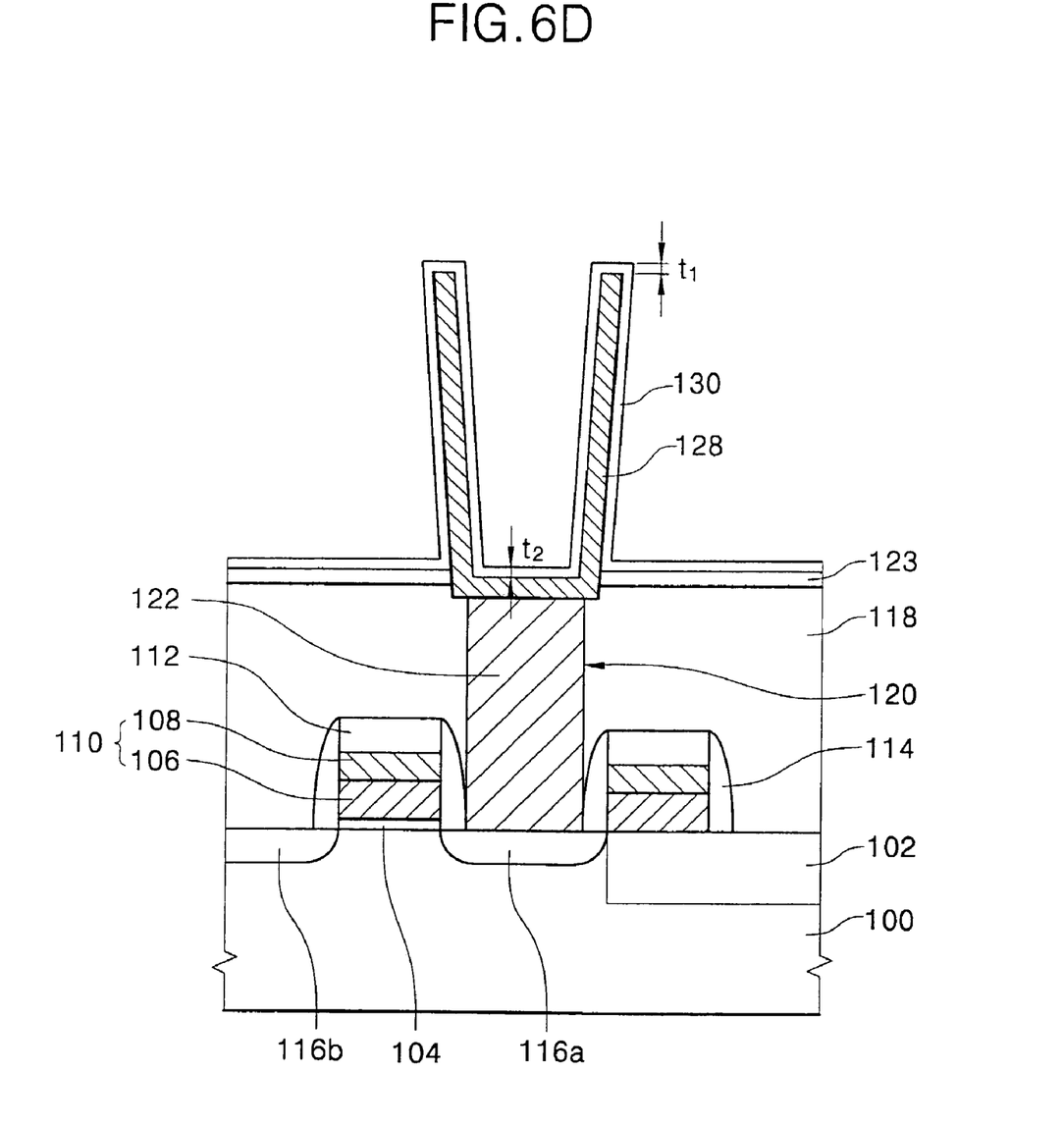

Referring to FIG. 6D, a dummy layer (not shown) is deposited on the second conductive layer 127 and on the opening portion 126, and subsequently, is etched back so that the second conductive layer 127 remains only on the sidewall and bottom surface of the opening portion 126. Accordingly, the second conductive layer 127 deposited on a surface of the second insulating layer 124 is removed, and only the second conductive layer 127 deposited along an inside profile of the opening portion 126 remains so that the second conductive layer 127 is separated into respective cell units of the substrate. Subsequently, the dummy layer is removed through a wet etching process, and finally a lower electrode layer 128 of a capacitor of the respective cell area is formed. Therefore, the lower electrode layer 128 is formed into a cylinder shape having a height of about 10,000 Å to about 17,000 Å with wide inlet and narrow bottom.

A dielectric layer 130 of the capacitor including TaTiO is formed on the lower electrode layer 128 through an ALD process according to some embodiments of the present invention using activated oxides, such as tantalum precursors, titanium precursors, ozone ($O_3$), plasma oxygen ($O_2$), remote plasma oxygen ($O_2$) and/or plasma $N_2O$. In some embodiments, the dielectric layer 130 of the capacitor including the TaTiO may be formed on the lower electrode layer 128 through the ALD process using the TT and ozone ($O_3$). Accordingly, the dielectric layer 130 can be deposited on the lower electrode layer 128 having an aspect ratio no less than about 10:1 with superior step coverage. In some embodiments of the present invention, the dielectric layer 130 can be deposited in such a structure such that a ratio between a upper thickness ($t_1$) and a lower thickness ($t_2$) is no less than about 1:0.9. When the lower electrode layer 128 is comprised of polysilicon, oxygen gases derived from the oxides are reacted with silicon in the lower electrode layer 128 and, therefore, the lower electrode layer 128 is oxidized during the process of forming the dielectric layer 130. Therefore, before the forming the dielectric layer 130, a surface of the lower electrode layer 128 may be nitrified through a rapid thermal nitrification (hereinafter, referred to as RTN) process in a nitride ambient for reducing or preventing the dielectric layer 130 from being reacted with the lower electrode layer 128.

After depositing the dielectric layer 130 through the ALD process by using oxides, the dielectric layer 130 is heat-treated in an oxygen ambient, such as ultraviolet-ozone (hereinafter, referred to as UV-$O_3$) so that impurities are removed and oxygen deficiency can be sufficiently cured. In addition, the heat treatment can transform a crystal state of the dielectric layer 130.

Figure 6E:
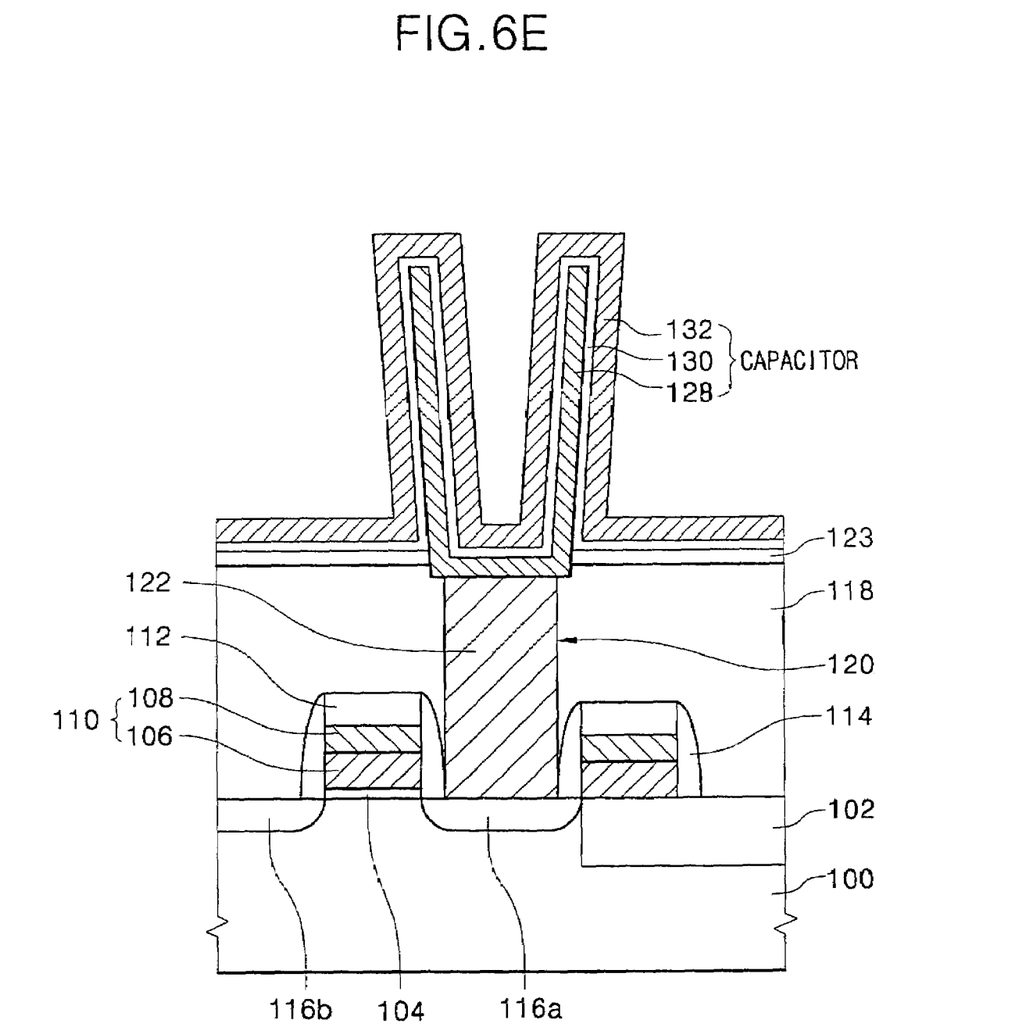

Referring to FIG. 6E, an upper electrode layer 132 of the dielectric layer 130 is deposited, and therefore, the capacitor C is formed to comprise the lower electrode layer 128, the dielectric layer 130, and the upper electrode layer 132. The upper electrode layer 132 can comprise a semiconductor material, rare metals, such as ruthenium (Ru), platinum (Pt), Iridium (Ir) and the like, or conductive metal nitride, such as titanium nitride (TiN), tantalum nitride (TaN), or tungsten nitride (WN). In some embodiments, the upper electrode layer 132 is formed to have a stacked structure of titanium nitride (TiN) and polysilicon.

It will be understood by those having skill in the art that many other configurations of integrated circuit field effect transistors and/or integrated circuit capacitors may be fabricated with gate dielectric layers and/or capacitor dielectric layers, respectively, according to embodiments of the present invention. Accordingly, the embodiments that were described with respect to FIGS. 6A–6E are exemplary and should not be regarded as limiting the present invention.

Measurement of a Capacitor Leakage Current

Figure 7:
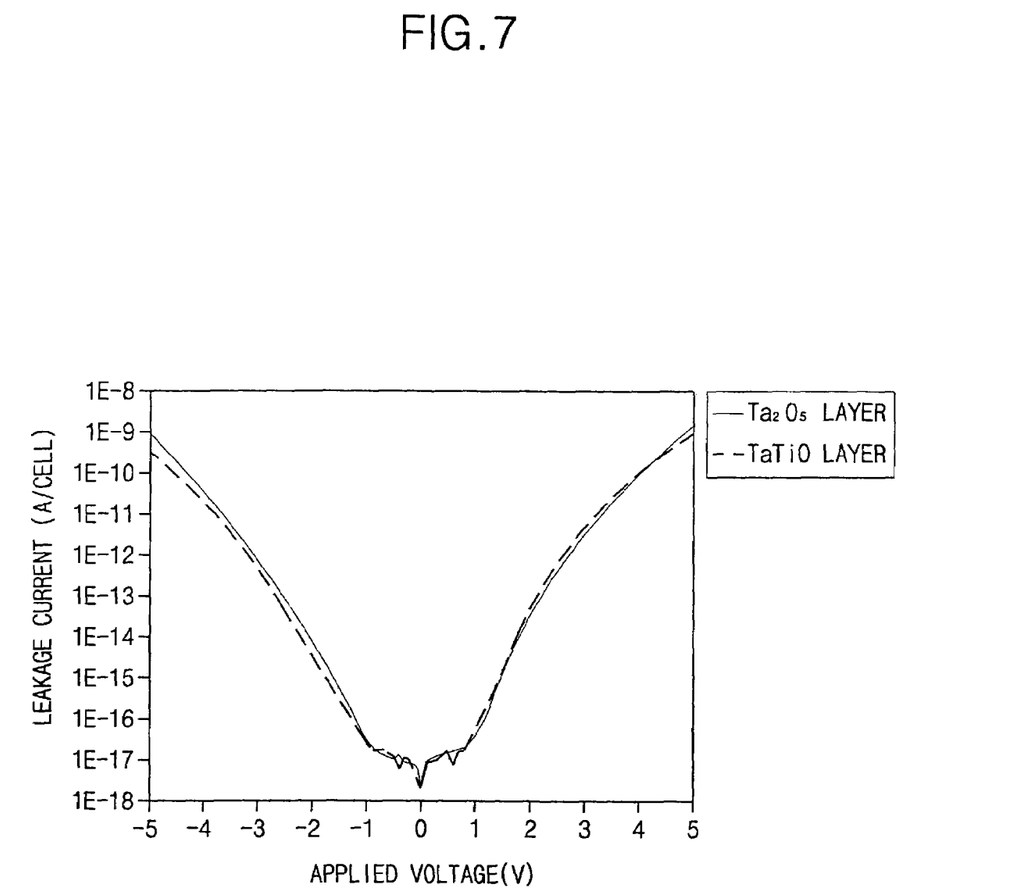
FIG. 7 and FIG. 8 are graphs showing a leakage current characteristic of a capacitor including a dielectric layer deposited through an ALD process according to embodiments of the present invention.
Figure 8:
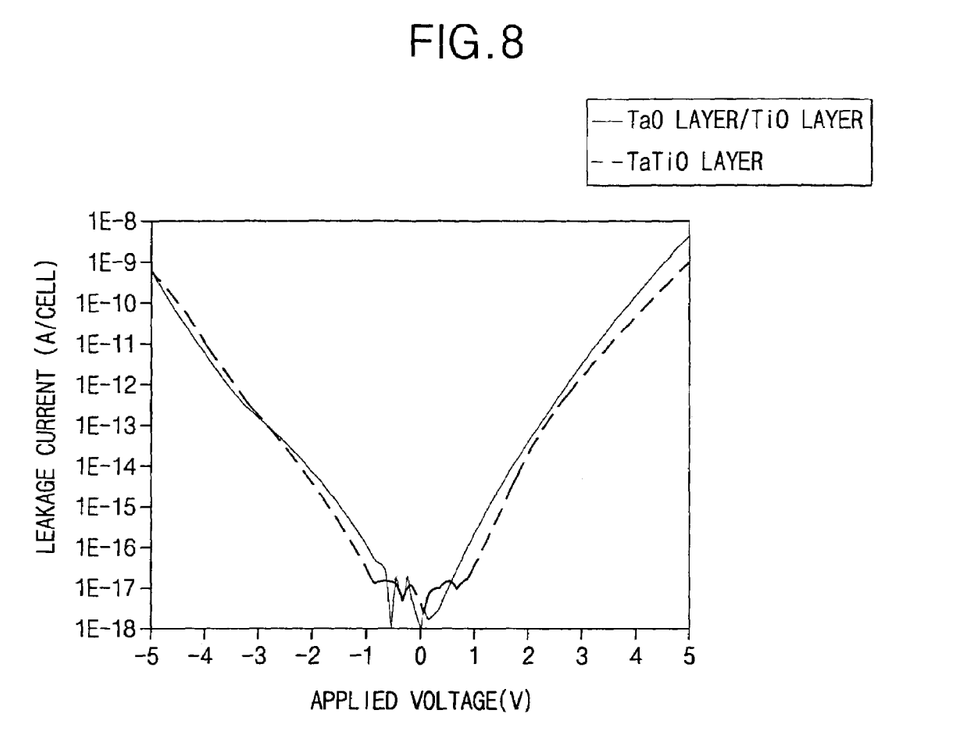

FIG. 7 and FIG. 8 are graphs showing a leakage current characteristics of a capacitor including a dielectric layer deposited through an ALD process according to embodiments of the present invention. In FIGS. 7 and 8, the horizontal axis denotes a voltage applied to the capacitor, and the vertical axis denotes a leakage current of the capacitor. Four groups of capacitors, a first to a fourth sample capacitors, were put into the experiment for measuring the leakage current of the capacitor.

The first sample capacitor was formed through the process as described in FIGS. 6A to 6E. First, a surface of the lower electrode layer including polysilicon doped with phosphorus (P) was nitrified through the RTP process. Then, a first TaTiO atomic layer was formed to a thickness of 20 Å on the lower electrode layer at a temperature range of about 200° C. to about 400° C. by using the TT and ozone ($O_3$), and a first heat treatment was carried out on the first TaTiO atomic layer by using UV-$O_3$ at a temperature of about 700° C. A second TaTiO atomic layer was formed to a thickness of 35 Å on the first TaTiO layer through an in situ multi-layer process by using the TT and ozone ($O_3$), and a second heat treatment was carried out on the second TaTiO atomic layer by using the UV-$O_3$ under the same conditions as the first heat treatment. Therefore, the TaTiO dielectric layer was formed of two atomic layers. Subsequently, a titanium nitride (TiN) layer was deposited on the TaTiO dielectric layer by using source gases, such as $TiCl_4$ or $NH_3$, and a P-doped polysilicon layer was deposited on the titanium nitride (TiN) layer. Thus, an upper electrode layer of capacitor was formed as a composite layer of TiN/polysilicon.

The second sample capacitor was formed as follows:

First, a first $Ta_2O_5$ layer was formed to a thickness of 20 Å, and a first heat treatment was carried out using the UV-$O_3$ on the first $Ta_2O_5$ layer. Then, a second $Ta_2O_5$ layer was formed to a thickness of 70 Å on the first $Ta_2O_5$ layer, and a second heat treatment was carried out using the UV-$O_3$ on the second $Ta_2O_5$ layer. Other process conditions were the same as those of the first sample capacitor. In FIG. 7, the leakage current of the first sample capacitor is expressed as a dotted line, and the leakage current of the second sample capacitor is displayed as a solid line.

Referring to FIG. 7, while the leakage current characteristic of the first and the second sample capacitors are similar to each other, the capacitance of the first and the second sample capacitor is 17.3 fF/cell and 15.3 fF/cell, respectively. Accordingly, when a TaTiO layer according to embodiments of the present invention is used as the dielectric layer of the capacitor, the capacitance of the capacitor can be increased 10% as compared when the $Ta_2O_5$ layer is used as the dielectric layer of the capacitor.

The third sample capacitor had the same structure as that of the first sample capacitor except that the second TaTiO layer had a thickness of about 30 Å.

The fourth sample capacitor was formed as follows: First, a $Ta_2O_5$ layer was formed to a thickness of 30 Å, and a first heat treatment was carried out using the UV-$O_3$ on the $Ta_2O_5$ layer. Then, a $TiO_2$ layer was formed to a thickness of 100 Å on the $Ta_2O_5$ layer, and a second heat treatment was carried out using the UV-$O_3$ on the $TiO_2$ layer. Other process conditions were the same as those of the first sample capacitor. In FIG. 8, the leakage current of the third sample capacitor is expressed as a dotted line, and the leakage current of the fourth sample capacitor is displayed as a solid line.

Referring to FIG. 8, while the effective thickness ($T_{ox}$) of the third and fourth sample capacitor are the same at about 31.1 Å, the leakage current characteristic of the third sample capacitor is superior to that of the fourth sample capacitor. Accordingly, when a TaTiO layer according to an embodiment of the present invention is used and the dielectric layer of the capacitor is formed as a single TaTiO layer, the leakage current characteristic of the capacitor can be sufficiently improved as compared when and the dielectric layer of the capacitor is formed as a sequentially stacked composite layer of the $Ta_2O_5$ layer and the $TiO_2$ layer.

Figure 9:
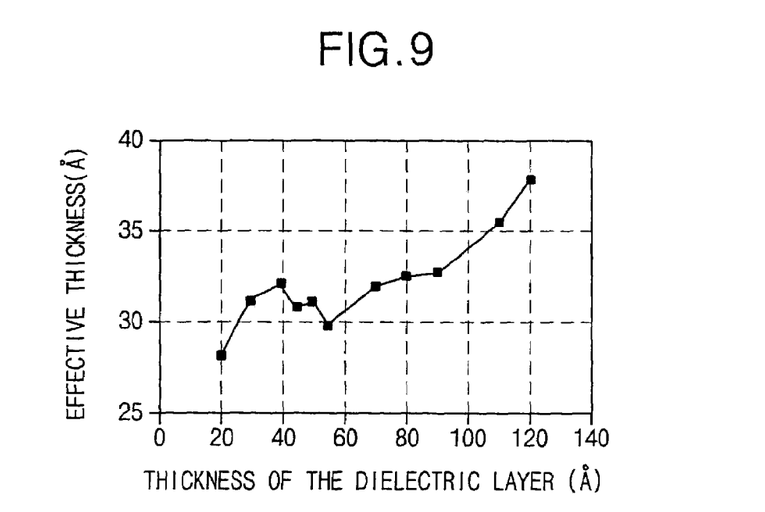
FIG. 9 is a graph showing a relation between a thickness variation of the dielectric layer and a thickness thereof deposited through an ALD process according to embodiments of the present invention.

Measurement of an Effective Thickness and Thickness Variance of the Dielectric Layer FIG. 9 is a graph showing a relation between thickness variation of the dielectric layer and an effective thickness thereof deposited through an ALD process according to embodiments of the present invention. The third sample capacitor was used in the experiment as one embodiment of the present invention. The effective thickness is expressed as $T_{ox}$, and means a thickness of oxide layer formed by chemical reaction between the lower electrode layer and the dielectric layer. Generally, the effective thickness is linearly proportional to a thickness of the dielectric layer.

Referring to FIG. 9, it can be noted that the effective thickness is increased when the thickness of the dielectric layer is about 55 Å, which indicates that the capacitance of the capacitor can be improved by forming the capacitor to have a thickness of dielectric layer at which the effective thickness is minimized.

According to embodiments of the present invention, a thin film of superior leakage current characteristic may be formed to have a high dielectric constant and good step coverage, which can be used in semiconductor devices including minute patterns. The thin film can be used as the dielectric layer of the capacitor, which can provide good step coverage, superior leakage current characteristic, and/or high dielectric constant. In addition, the thin film may be hardly oxidized on a lower electrode layer having a high aspect ratio. Furthermore, the thin film can also be used as a gate dielectric layer of a transistor that can reduce or minimize oxidation on a boundary surface. Therefore, the reliability of the semiconductor device can be improved by forming a thin film using the above-described methods.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of forming a thin film layer through an atomic layer deposition process, comprising:
   introducing a first reacting material including a tantalum precursor and a titanium precursor to a substrate to chemisorb a portion of the first reacting material onto the substrate; and
   introducing a second reacting material including oxygen to the substrate to chemisorb a portion of the second reacting materials onto the substrate and to form a solid material thereon.

2. The method of forming a thin film layer as claimed in claim 1, wherein the tantalum precursor includes at least one selected from the group consisting of $TaCl_5$, $Ta(OCH_3)_5$, $Ta(OC_2H_5)_5$, $Ta(OC_3H_7)_5$, $Ta(OC_4H_9)_5$, $Ta(OC_2H_5)$ $(OC_3H_7)_4$, and TAT-DAME, and the titanium precursor includes at least one selected from the group consisting of $TiCl_4$, $Ti(OCH_3)_4$, $Ti(OC_2H_5)_4$, $Ti(OC_3H_7)_4$, $Ti(OC_4H_9)_4$, $Ti(OC_2H_5)(OC_3H_7)_4$, $Ti(OC_3H_7)_2(O_2C_{11}H_{19})_2$, and $Ti(OE_2)$ $(DAME)_2$.

3. The method of forming a thin film layer as claimed in claim 1, wherein the first reacting material comprises mixed precursors including the tantalum precursor and the titanium precursor.

4. The method of forming a thin film layer as claimed in claim 3, wherein the mixed precursors include TAT-DAME/ $Ti(OEt)_2(DAME)_2$ and/or $Ta(OC_2H_5)_5/Ti(OC_2H_5)_4$.

5. The method of forming a thin film layer as claimed in claim 3, wherein the mixed precursors are introduced onto the substrate through one line such that the tantalum precursor and the titanium precursor are mixed.

6. The method of forming a thin film layer as claimed in claim 1, wherein the second reacting material is at least one selected from the group consisting of $O_2$, $O_3$, $H_2O$, $N_2O$, and alcohols including —OH group.

7. The method of forming a thin film layer as claimed in claim 1, wherein the second reacting material is activated by ultraviolet rays, or is activated in a state of a plasma gas or a remote plasma gas.

8. The method of forming a thin film layer as claimed in claim 1, wherein the solid material includes a tantalum titanium oxide (TaTiO) thin film.

9. The method of forming a thin film layer as claimed in claim 1, wherein the solid material is a dielectric layer of a capacitor of a semiconductor device.

10. The method of forming a thin film layer as claimed in claim 1, wherein the solid material is a gate dielectric layer of a transistor.

11. The method of forming a thin film layer as claimed in claim 1, wherein an atomic ratio of tantalum to titanium in the solid material is about 1:0.01 to 0.2.

12. The method of forming a thin film layer as claimed in claim 1, wherein the first reacting material and the second reacting material are introduced onto the substrate using an inert gas.

13. The method of forming a thin film layer as claimed in claim 1, wherein the first reacting material and the second reacting material are introduced at about 200° C. to about 450° C., and under pressure of about 0.1 to about 10 Torr.

14. The method of forming a thin film layer as claimed in claim 1, wherein the introducing a first reacting material and the introducing a second reacting material are repeated at least once in sequence.

15. The method of forming a thin film layer as claimed in claim 1, wherein the introducing a first reacting material further comprises purging at least some non-chemisorbed first reacting material from the substrate, and the introducing a second reacting material further comprises purging at least some non-chemisorbed second reacting material from the substrate.

16. The method of forming a thin film layer as claimed in claim 15, wherein the first and the second reacting materials are purged by using an inert gas.

17. The method of forming a thin film layer as claimed in claim 1, further comprising heat-treating the solid material after the introducing a second reacting material.

18. The method of forming a thin film layer as claimed in claim 17, wherein the heat-treating the solid material is carried out by irradiating ozone ($O_3$) ultraviolet rays at about 650° C. to about 750° C.

19. The method of forming a thin film layer as claimed in claim 17, wherein the heat-treating the solid material is carried out by flowing oxygen at about 700° C. to about 800° C.

20. The method of forming a thin film layer as claimed in claim 17, wherein the heat-treating the solid material is carried out at least once.

21. A method of forming a capacitor of a semiconductor device, comprising:

forming a lower electrode of the capacitor on a substrate;

forming a dielectric layer of the capacitor including titanium tantalum oxide on the substrate by discontinuously introducing a first reacting material, a second reacting material, and a purge gas onto the lower electrode, chemisorbing a portion of the first reacting material and the second reacting material onto the substrate, and purging at least some non-chemisorbed first and second reacting materials from the substrate, wherein the first reacting material includes a tantalum precursor and a titanium precursor, and the second reacting material includes oxygen; and forming an upper electrode of the capacitor on the dielectric layer.

22. The method of forming a capacitor of a semiconductor device as claimed in claim 21, wherein the lower electrode includes at least one selected from the group consisting of TiN, WN, Ru, Pt, and Ir, and the upper electrode includes at least one selected from the group consisting of polysilicon, TiN, WN, Ru, Pt, and Ir.

23. The method of forming a capacitor of a semiconductor device as claimed in claim 21, wherein the lower electrode has an aspect ratio ranging from about 5:1 to about 15:1.

24. The method of forming a capacitor of a semiconductor device as claimed in claim 21, wherein the tantalum precursor includes at least one selected from the group consisting of $TaCl_5$, $Ta(OCH_3)_5$, $Ta(OC_2H_5)_5$, $Ta(OC_3H_7)_5$, $Ta(OC_4H_9)_5$, $Ta(OC_2H_5)(OC_3H_7)_4$, and TAT-DAME, the titanium precursor includes at least one selected from the group consisting of $TiCl_4$, $Ti(OCH_3)_4$, $Ti(OC_2H_5)_4$, $Ti(OC_3H_7)_4$, $Ti(OC_4H_9)_4$, $Ti(OC_2H_5)(OC_3H_7)_4$, $Ti(OC_3H_7)_2(O_2C_{11}H_{19})_2$, and $Ti(OEt_2)(DAME)_2$, and the second reacting materials include at least one selected from the group consisting of $O_2$, $O_3$, $H_2O$, $N_2O$, and alcohols including —OH group.

25. The method of forming a capacitor of a semiconductor device as claimed in claim 21, wherein the first reacting material comprises a mixed precursor including the tantalum precursor and the titanium precursor, and is introduced through one line such that the tantalum precursor and the titanium precursor are mixed.

26. The method of forming a capacitor of a semiconductor device as claimed in claim 25, wherein the mixed precursor includes TAT-DAME/$Ti(OEt)_2(DAME)_2$ and/or $Ta(OC_2H_5)_5$/$Ti(OC_2H_5)_4$.

27. The method of forming a capacitor of a semiconductor device as claimed in claim 21, wherein the dielectric layer has a thickness of about 5 Å to about 20 Å.

28. The method of forming a capacitor of a semiconductor device as claimed in claim 21, further comprising the step of heat-treating the dielectric layer in an oxygen ambient.

29. A method of forming a transistor, comprising:

forming a gate dielectric layer of the transistor including tantalum titanium oxide on a substrate by discontinuously introducing a first reacting material, a second reacting material, and a purge gas onto the substrate, chemisorbing a portion of the first reacting material and the second reacting material onto the substrate, and purging at least some non-chemisorbed first and second reacting materials from the substrate, wherein the first reacting material includes a tantalum precursor and a titanium precursor and the second reacting material includes oxygen;

forming a gate electrode on the gate dielectric layer; and forming source and drain regions in the substrate.

30. The method of forming a transistor as claimed in claim 29, wherein the tantalum precursor includes at least one selected from the group consisting of $TaCl_5$, $Ta(OCH_3)_5$, $Ta(OC_2H_5)_5$, $Ta(OC_3H_7)_5$, $Ta(OC_4H_9)_5$, $Ta(OC_2H_5)(OC_3H_7)_4$, and TAT-DAME, the titanium precursor includes at least one selected from the group consisting of $TiCl_4$, $Ti(OCH_3)_4$, $Ti(OC_2H_5)_4$, $Ti(OC_3H_7)_4$, $Ti(OC_4H_9)_4$, $Ti(OC_2H_5)(OC_3H_7)_4$, $Ti(OC_3H_7)_2(O_2C_{11}H_{19})_2$, and $Ti(OEt_2)(DAME)_2$, and the second reacting material includes at least one selected from the group consisting of $O_2$, $O_3$, $H_2O$, $N_2O$, and alcohols including —OH group.

31. The method of forming a transistor as claimed in claim 29, wherein the first reacting material comprises a mixed precursor including the tantalum precursor and the titanium precursor, and is introduced through one line such that the tantalum precursor and the titanium precursor are mixed.

32. The method of forming a transistor as claimed in claim 29, wherein the mixed precursor includes TAT-DAME/$Ti(OEt)_2(DAME)_2$ and/or $Ta(OC_2H_5)_5$/$Ti(OC_2H_5)_4$.

33. The method of forming a transistor as claimed in claim 29, further comprising the step of heat-treating the dielectric layer in an oxygen ambient.

* * * * *

UNITED STATES PATENT AND TRADEMARK OFFICE
CERTIFICATE OF CORRECTION

PATENT NO. : 7,201,943 B2 Page 1 of 1
APPLICATION NO. : 10/372727
DATED : April 10, 2007
INVENTOR(S) : Park et al.

It is certified that error appears in the above-identified patent and that said Letters Patent is hereby corrected as shown below:

Column 12, Claim 2, Line 4:  Please correct "and $Ti(OE_2)$"
To read -- and $Ti(OEt_2)$ --

Signed and Sealed this

Tenth Day of July, 2007

JON W. DUDAS
*Director of the United States Patent and Trademark Office*